US010637391B2

(12) United States Patent
Forrest et al.

(10) Patent No.: US 10,637,391 B2
(45) Date of Patent: Apr. 28, 2020

(54) AUTONOMOUS SOLAR TRACKING IN FLAT-PLATE PHOTOVOLTAIC PANELS USING KIRIGAMI-INSPIRED MICROSTRUCTURES (71) Applicant: The Regents of the University of Michigan, Ann Arbor, MI (US)

(72) Inventors: Stephen R. Forrest, Ann Arbor, MI (US); Kyusang Lee, Ann Arbor, MI (US); Matthew Shlian, Ann Arbor, MI (US); Chih-Wei Chien, Ann Arbor, MI (US); Peicheng Ku, Ann Arbor, MI (US); Aaron Lamoreux, Ann Arbor, MI (US); Max Shtein, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 545 days.

(21) Appl. No.: 15/034,299

(22) PCT Filed: Nov. 28, 2014

(86) PCT No.: PCT/US2014/067820
§ 371 (c)(1),
(2) Date: May 4, 2016

(87) PCT Pub. No.: WO2015/081320
PCT Pub. Date: Jun. 4, 2015

(65) Prior Publication Data
US 2016/0285410 A1 Sep. 29, 2016

Related U.S. Application Data (60) Provisional application No. 61/910,160, filed on Nov. 29, 2013.

(51) Int. Cl.
*H02S 20/32* (2014.01)
*H02S 30/20* (2014.01)
(Continued)

(52) U.S. Cl.
CPC ........ *H02S 20/32* (2014.12); *H01L 31/03046* (2013.01); *H01L 31/054* (2014.12);
(Continued)

(58) Field of Classification Search
CPC ................................ H02S 20/32; H02S 20/30
See application file for complete search history.

(56) References Cited

U.S. PATENT DOCUMENTS

2002/0074033 A1 6/2002 Kular et al.
2011/0277813 A1* 11/2011 Rogers ............ H01L 31/035281
136/244

(Continued)

FOREIGN PATENT DOCUMENTS

DE 200 08 441 U1 7/2000
GB 2 250 064 A 5/1992

OTHER PUBLICATIONS

International Search Report & Written Opinion dated Mar. 11, 2015, PCT/US2014/067820.

*Primary Examiner* — Daniel P Malley, Jr.
(74) *Attorney, Agent, or Firm* — Finnegan, Henderson, Farabow, Garrett & Dunner, LLP (57) ABSTRACT There is disclosed Kirigami-inspired structures for use in solar tracking applications. When coupled with thin-film active materials, the disclosed microstructures can track solar position and maximize solar power generation. In one embodiment, there is disclosed a photovoltaic system comprising a single-axis, or multi-axis solar tracking structure comprising a support structure made of a flexible material having a defined unit cell structure, and a flexible photovol- (Continued)

taic cell disposed on the support structure. There is also disclosed methods of making such structures in which the photovoltaic cell is mounted to the support structure by a direct-attachment bonding processes such as cold-welding.

14 Claims, 7 Drawing Sheets (51) Int. Cl.
*H01L 31/054* (2014.01)
*H01L 31/0304* (2006.01)
*H01L 31/18* (2006.01)

(52) U.S. Cl.
CPC .......... *H01L 31/1844* (2013.01); *H02S 30/20* (2014.12); *Y02E 10/52* (2013.01)

(56) References Cited

U.S. PATENT DOCUMENTS

| | | | | |
|---|---|---|---|---|
| 2012/0106095 A1* | 5/2012 | Daniel | ................. | H05K 1/0283 |
| | | | | 361/746 |
| 2015/0303867 A1* | 10/2015 | Angel | ................. | H01L 31/0547 |
| | | | | 136/246 |
| 2015/0342050 A1* | 11/2015 | Jiang | ................... | H05K 1/0278 |
| | | | | 361/749 |
| 2016/0043254 A1* | 2/2016 | Krause | ............... | H01L 31/1876 |
| | | | | 136/244 |

\* cited by examiner

AUTONOMOUS SOLAR TRACKING IN FLAT-PLATE PHOTOVOLTAIC PANELS USING KIRIGAMI-INSPIRED MICROSTRUCTURES

This application claims priority to U.S. Provisional Application No. 61/910,160, filed on Nov. 29, 2013, which is incorporated herein by reference in its entirety.

STATEMENT REGARDING FEDERALLY SPONSORED RESEARCH

This invention was made with U.S. Government support under Contract No. NSF ERFI-1240264 awarded by National Science Foundation. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and NanoFlex Power Corporation. The agreement was in effect on and before the date the subject matter of the present disclosure was prepared, and was made as a result of activities undertaken within the scope of the agreement.

The present disclosure relates to photovoltaic (PV) panels and more particularly to enabling autonomous solar tracking in PV panels using origami-inspired microstructures.

Efficient solar energy conversion requires collecting as many photons as possible in a given area via means such as solar tracking and concentration. Although flat-plate photovoltaic (PV) panels are attractive for their low costs and direct compatibility for building integration, they are often installed in fixed positions, making solar tracking and/or concentration extremely challenging.

Optical tracking increases the power output of solar panels, but conventional tracking systems are costly, complex, and require cumbersome structural components to support system weight and wind loading. Further, solar tracking contributes significantly to total solar balance of system costs, that today exceed the module cost itself. For these reasons, pitched rooftop photovoltaics that represents a significant contribution to the solar market, have been devoid of solar tracking options entirely.

The inventors have discovered that Kirigami structures combined with thin-film active materials may be used as a simple means to track solar position, thereby maximizing solar power generation. The low-profile, lightweight, and continuous nature of these systems provides benefits over traditional mechanisms, where additional components and mechanical supports are often required to synchronize tracking between panels and accommodate forces due to wind loading. Their use can therefore lead to new solar tracking systems, used in traditional settings, such as widespread rooftop installations. When combined with thin film and low cost solar cells, these systems can significantly decrease both the module an balance of systems costs now limiting the deployment of solar electricity generation.

In addition to the foregoing benefits, Kirigami-enabled systems are cost-efficient in both fabrication and materials, and such constructs may be extended for use in a wide range of optical and mechanical applications, including phased array radar and optical beam steering.

Thus, there is disclosed origami-inspired microstructures to achieve autonomous solar tracking in the flat-plate architecture. The basic principle lies in morphing the semiconductor solar materials into paper-like thin films and creating origami-type structures as one would do on an actual sheet of paper. Unlike conventional microelectromechanical systems ("MEMS") whose system functions rely on collective motions of each individual part, origami structures morph themselves in a collective continuous way that is governed by folding geometry and microscopic texture of the "paper". The force applied in an origami structure is not localized but is distributed to the entire structure, again governed by topology and micro-textures. This disclosure exploits these unique properties of origami arts to enable autonomous solar tracking in a flat-plate PV panel.

In one embodiment, there is disclosed a photovoltaic system, comprising a single or multi-axis solar tracking structure comprising a support structure comprising a flexible material having a defined unit cell structure; and a flexible photovoltaic cell disposed on the support structure.

In an embodiment, the unit cell is defined by a pattern of openings in the support structure, wherein the pattern of openings comprises a cut length ($L_C$), an uncut length ($L_U$), and a spacing between cuts ($W_C$), which can be expressed in terms of the dimensionless parameters $R_1$ and $R_2$ where $$R_1 = L_C/L_U \text{ and } R_2 = L_C/W_C.$$

In an embodiment, $R_1 = R_2$.

In another embodiment, there is disclosed a method of making a photovoltaic system comprising a solar tracking structure, the method comprising forming patterns of cuts or openings on a support structure. The pattern of cuts or openings defines a unit cell structure and provides folding geometry and microscopic texture to the semiconductor solar materials. In one embodiment, the cuts or openings that define a unit cell structure have a cut length ($L_C$), an uncut length ($L_U$), and a spacing between cuts ($W_C$), which can be expressed in terms of the dimensionless parameters $R_1$ and $R_2$ where $$R_1 = L_C/L_U \text{ and } R_2 = L_C/W_C, \text{ and } R_1 = R_2.$$

The method of making the photovoltaic system comprises the coating one surface of the support structure with a metal, forming a photovoltaic cell comprising a flexible crystalline semiconducting material, coating one surface of the photovoltaic cell with a metal, and mounting the photovoltaic cell on the support structure by a direct-attachment bonding process, such as cold-welding.

In one embodiment, the structure made from the disclosed method resembles an expanded mesh created by linear and offset cuts in a sheet, stretched so that the elements of the structure tilt and track the light source to achieve the desired angle of incidence. In another embodiment, the cuts are made such that curving the base sheet allows a portion of that sheet to remain flat and also track a light source. Both embodiments can be coupled with a Winston-like collector/concentrator optic which can also be made using origami techniques. Example embodiments are described more fully in the attachments.

Aside from the subject matter discussed above, the present disclosure includes a number of other exemplary features such as those explained hereinafter. It is to be understood that both the foregoing description and the following description are exemplary only.

BRIEF DESCRIPTION OF THE DRAWINGS

The accompanying figures are incorporated in, and constitute a part of this specification.

DETAILED DESCRIPTION

Definitions

As used herein, "origami," "origami-inspired," "origami-based," or versions thereof refers to folded plate structures that are typical of the Japanese paper folding art.

As used herein, "kirigami", "kirigami-inspired" or "kirigami-based" is a variation of origami that includes cutting of the plate structures, rather than solely folding the plates as is the case with origami.

As used herein, the term "III-V material," may be used to refer to compound crystals containing elements from group IIIA and group VA of the periodic table. More specifically, the term "III-V material" may be used herein to refer to compounds which are combinations of the group of Gallium (Ga), Indium (In) and Aluminum (Al), and the group of Arsenic (As), Phosphorus (P), Nitrogen (N), and Antimony (Sb).

It should be noted that the III-V compounds herein are named in an abbreviated format. A two component material is considered to be in approximately a 1:1 molar ratio of group III:V compounds. In a three or more component system (e.g. InGaAlAsP), the sum of the group III species (i.e. In, Ga, and Al) is approximately 1 and the sum of the group V components (i.e. As, and P) is approximately 1, and thus the ratio of group III to group V is approximately unity.

Names of III-V compounds are assumed to be in the stoichiometric ratio needed to achieve lattice matching or lattice mismatching (strain), as inferred from the surrounding text. Additionally, names can be transposed to some degree. For example, AlGaAs and GaAlAs are the same material.

As used and depicted herein, a "layer" refers to a member or component of a device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

Figure 1:
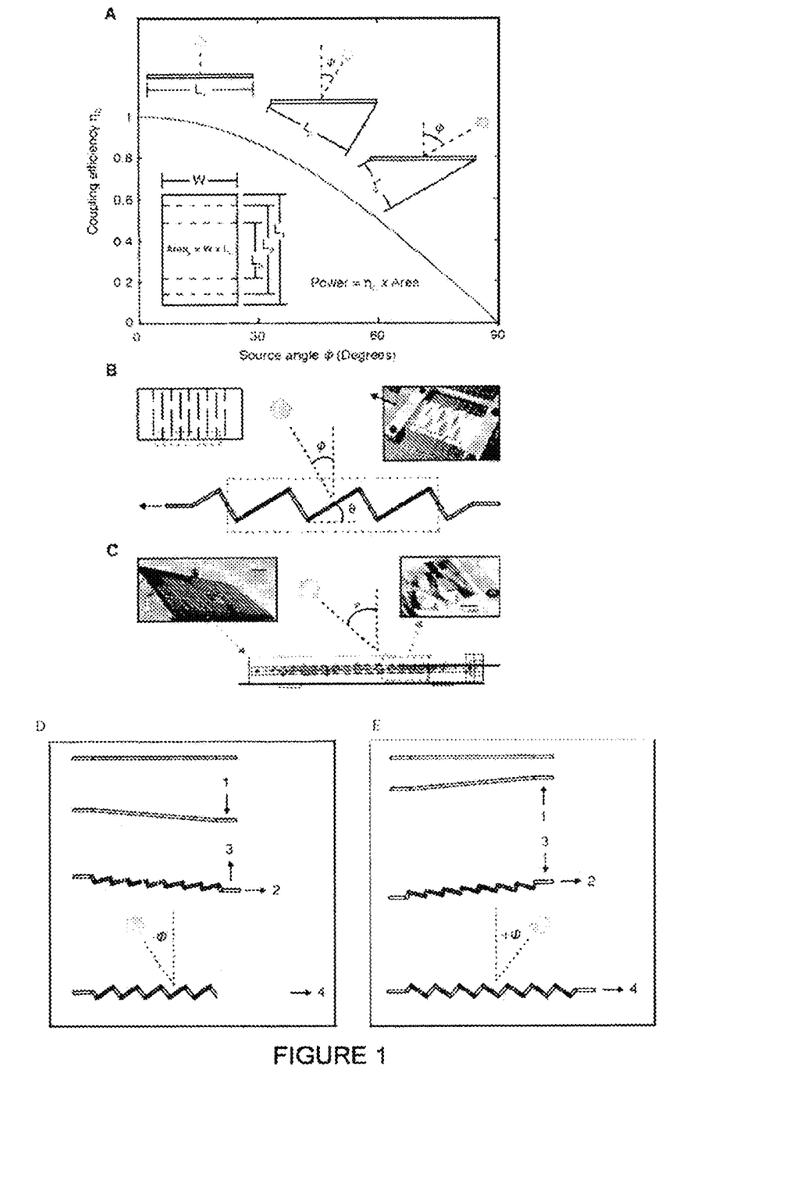
FIG. 1A is a graph representation of coupling efficiency, $\eta_C$, vs. source angle, $\phi$, for a planar solar panel. The panel projected area decreases with the cos $\phi$.
FIG. 1B is a kirigami-based tracking structure according to the present disclosure that, upon stretching, simultaneously changes the angle of the elements comprising the sheet.
FIG. 1C exemplifies a thin-film kirigami construct according to the present disclosure, which may be integrated with low-profile, rigid enclosures to ensure weatherproofing and compatibility with existing rooftop installation hardware.
FIG. 1D is a schematic showing how to facilitate a negative change in feature angle, which requires a downward bias in the out-of-plane direction (1).
FIG. 1E is a schematic showing how to facilitate a positive change in feature angle, which requires an upward bias in the out-of-plane direction (1).

Conventional solar cell modules suffer optical coupling losses due to a decrease in projected area that scales with the cosine of the angle of the sun from its zenith (FIG. 1A). To increase power output from a given cell area, solar tracking is often employed. Solar tracking is particularly necessary with concentrator components such as parabolic reflectors, Fresnel lenses, luminescent films, and microconcentrator optics. Despite the relatively mature state of solar tracking technology, the mechanisms have remained costly, complex, bulky, and consequently prone to malfunction and wind loading. Tracking systems are typically confined to ground-based or flat rooftop installations, leaving out an important market segment of pitched rooftop installation (e.g. residential sites). While flexible and stretchable electronics have been explored for use with solar cells on non-planar and deformable surfaces, such systems require cumbersome structural components to facilitate optical tracking.

Given the rapid reduction in solar module costs to well below that required for their installation (i.e. the "balance of systems", or BOS, costs), it is imperative to re-examine all the technologies and assumptions heretofore developed for solar energy generation. For this reason, the Inventors have designed and demonstrated a new paradigm for solar tracking that is based on the ancient art of kirigami, a form of origami that involves cutting as well as folding to achieve a desired shape. Origami and kirigami have been used in the engineering design of airbags, deployable optical components solar arrays used in space, reprogrammable metamaterials, and load-bearing metal structures. A similar approach is also shown here to be useful in realizing integrated, low-profile solar tracking systems when combined with the low cost, high efficiency process of non-destructive epitaxial lift off (ND-ELO) of thin film, GaAs solar cells.

Consider a conventional single-axis solar tracking array whereby the panels are tilted to track the sun's path throughout the day in FIG. 1A. Due to their substantial mass and susceptibility to wind loading, these systems are typically installed at ground level, where there are significant costs associated with concrete foundations, supporting structures, and land preparation. For larger tracking arrays, additional components are also required to synchronize movement between panels, further increasing their cost and complexity (e.g. cable systems, robotics). Notably, while the cost of semiconductors in solar cells has been dramatically reduced over the last several decades, the cost of structural components has not kept pace. In fact, current status and projections indicate that well over 60% of the total cost of solar energy generation is due to the BOS (comprising labor, electrical, structural, and other, non-module components).

Consider, instead, the simple kirigami structure in FIG. 1B, consisting of a linearly cut pattern in an otherwise thin, continuous sheet of material. Pulling on the sheet along its length results in controlled instabilities defined by the cut geometry that produce buckling in the transverse direction, along with a change in feature angle that is synchronized along its length. Furthermore, it is possible to control the direction of the change in angle (i.e. positive or negative) by applying an out-of-plane force to one side of the kirigami sample prior to the straining process (FIGS. 1D and 1E).

The conditions used to facilitate a negative change in feature angle that requires a downward bias in the out-of-plane direction (1) is achieved by pushing down on one end of the sample, and subsequently straining at a very small value (2), is shown in FIG. 1D. The vertical bias is then removed, returning the plane of the sample back to horizontal (3). The sample can then be strained with the change in feature angle continuing in the negative direction (4).

In contrast, the conditions used to facilitate a positive change in feature angle by facilitating a positive change in feature angle, which requires an upward bias in the out-of-plane direction (1) is shown in FIG. 1E. After a small strain in the axial direction (2) to initiate the change in feature angle, the sample is then returned to horizontal (3), and continually strained with the subsequent change in feature angle being in the positive direction (4).

To apply the forces needed to initiate a strain or change in feature angle, as described above, the photovoltaic system described herein may further comprise one or more actuators operably coupled to the support structure. In this embodiment, the support structure and the photovoltaic cell change their shapes in response to the force applied by the actuator.

The photovoltaic system described herein may further include optical concentrators to increase solar capture efficiency of the system, including a Winston-like collector or other optic concentrator.

In practice, these thin-film constructs may be integrated with rigid, low-profile enclosures to ensure a weatherproof system and compatibility with existing flat panel mounting hardware for rooftop installation (FIG. 1C).

Figure 2:
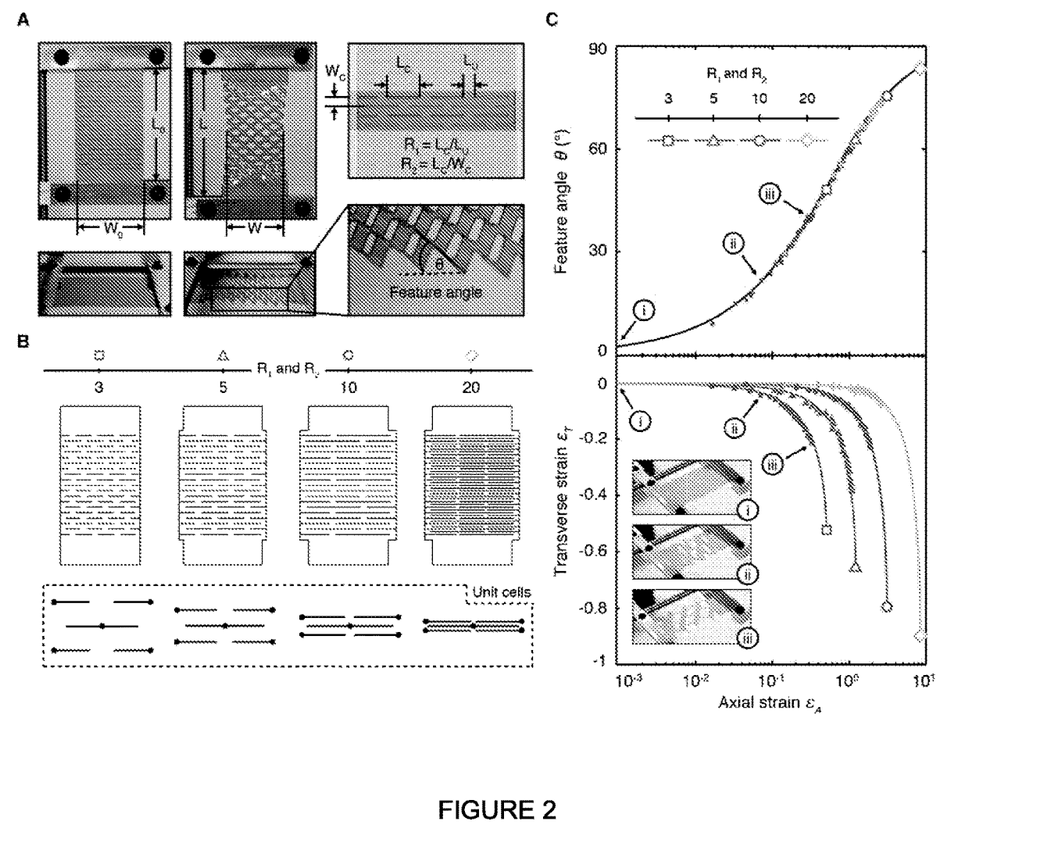
FIG. 2A is a photograph showing the response of a Kapton® kirigami structure to stretching in the axial direction, and how it is accompanied by a decrease in sample width and a change in feature angle, $\theta$. Also shown are the characteristic cut parameters cut length $L_C$, uncut length $L_U$, and cell width $W_C$, which can be expressed in terms of the dimensionless parameters, $R_1$ and $R_2$.
FIG. 2B show schematics of four kirigami structures, where $R_1=R_2=3$, 5, 10, and 20, along with their corresponding units cells.
FIG. 2C is a graph showing transverse strain, $\varepsilon_T$, and feature angle, $\theta$, vs. axial strain, $\varepsilon_A$, for several kirigami structures where $R_1=R_2=3$, 5, 10, and 20 (FIG. 2B). Theoretical predictions are shown by solid lines, while the closed symbols represent experimental data from a 50 μm-thick Kapton® sample of the appropriate geometry. While larger $R_1$ and $R_2$ enable increased axial strains and correspondingly larger transverse strains, the change in feature angle is independent of cut geometry.

System response is clarified in FIG. 2A for a Kapton® kirigami sheet tracker, along with the cut length, $L_C$, uncut length, $L_U$, and the spacing between cuts, $W_C$. The change in feature angle, $\theta$, and decrease in sample width (transverse strain, $\varepsilon_T$) as a function of axial strain, $\varepsilon_A$ is given by:

$$\theta = \cos^{-1}\left(\frac{1}{\varepsilon_A + 1}\right) \quad (1)$$

$$\varepsilon_T = \frac{R_1 - 1}{R_1 + 1}\left[\cos\left(\sin^{-1}\left(\frac{2R_1\tan\theta}{R_1 R_2 - R_2}\right)\right) - 1\right] \quad (2)$$

where $R_1 = L_C/L_U$ and $R_2 = L_C/W_C$ are used as dimensionless cut parameters.

In one embodiment, $R_1$ and $R_2$ were varied for four samples, where $R_1 = R_2 = 3, 5, 10$, and 20, as shown in FIG. 2B. The response characterized by Eqs. 1 and 2 is experimentally verified in FIG. 2C for each kirigami structure. Experimental data are indicated by closed symbols, whereas the responses according to Eqs. 1 and 2 are shown as solid lines. Larger $R_1$ and $R_2$ enable increased axial strains and correspondingly larger transverse strains.

In an embodiment there is disclosed a photovoltaic system, comprising: a solar tracking structure comprising: a support structure comprising a flexible material having a unit cell structure defined by a pattern of openings in the support structure, wherein said pattern of openings comprises a cut length ($L_C$), an uncut length ($L_U$), and a spacing between cuts ($W_C$), which can be expressed in terms of the dimensionless parameters $R_1$ and $R_2$ where $R_1 = L_C/L_U$ and $R_2 = L_C/W_C$ and a flexible photovoltaic cell disposed on the support structure. In an embodiment, $R_1 = R_2$.

The flexible material comprises, in an embodiment, a plastic material, such as a polyimide, or metal foil. The support structure typically has a thickness ranging from 25 to 100 μm, such as from 25 to 80 μm, from 25 to 70 μm, from 25 to 60 μm, from 30 to 80 μm, from 30 to 70 μm, from 30 to 60 μm, from 40 to 80 μm, from 40 to 70 μm, and from 40 to 60 μm.

When the flexible material comprises a plastic material, it typically has a conductive metal coating on one surface. Non-limiting examples of the metal coating includes at least one metal chosen from Au, Ag, Pt, Pd, Ni, and Cu, with a particular emphasis on Au. In one embodiment, the Au layer on the support substrate has a thickness ranging from 100 to 500 μm, such as from 100 to 400 μm, from 100 to 300 μm, from 200 to 500 μm, 200 to 400 μm, from 200 to 300 μm, and from 300 to 500 μm.

A plot of θ vs. $\varepsilon_A$ confirms that the change in feature angle in response to axial strain is independent of cut geometry. For the samples tested, θ was controlled to within ±1.0° of its value in Eq. 1. Also shown are the pseudo-plastic limits for each kirigami superstructure, where the maximum axial strains and corresponding maximum feature angles, $\theta_{MAX}$, are depicted as open symbols. For each structure, $\theta_{MAX}$ is solely dependent on cut geometry, setting the upper limit of tracking without shadowing in the axial direction. That is:

$$\theta_{MAX} = \tan^{-1}\left(\frac{R_1 R_2 - R_2}{2R_1}\right) \quad (3)$$

To evaluate the tracking efficiency of the kirigami structure, the optical coupling efficiency, $\eta_C$ was calculated as:

$$\eta_C = \cos\phi(\varepsilon_A + 1)(\varepsilon_T + 1) \quad (4)$$

where φ is the source angle from the normal to the module plane (see FIG. 1A), and $\varepsilon_A$ and $\varepsilon_T$ are the axial and transverse strains, respectively.

Figure 3:
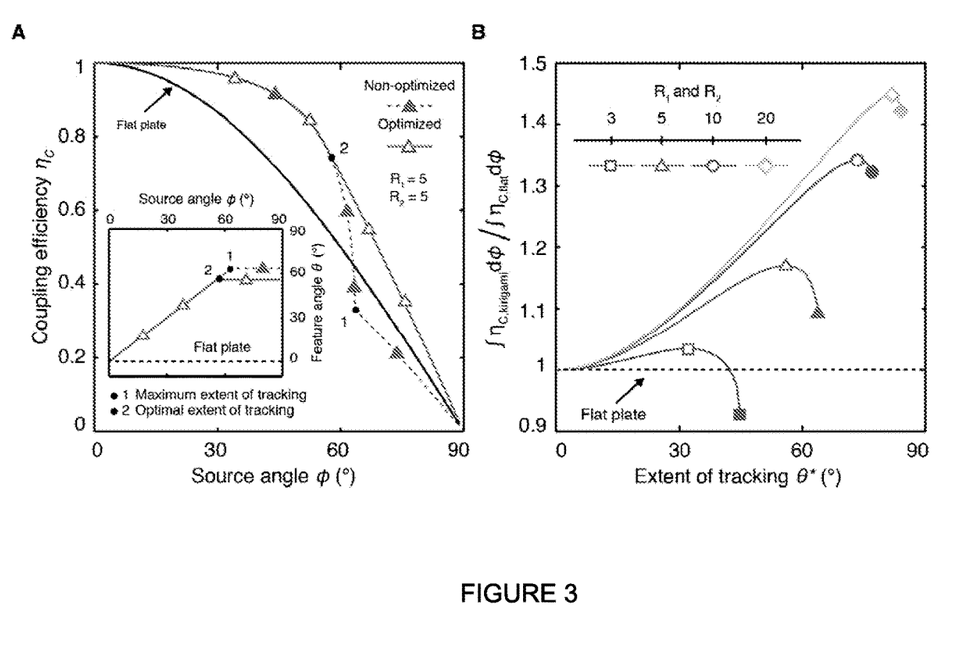
FIG. 3A is a graph showing coupling efficiency, $\eta_C$, vs. solar angle, $\phi$ for two systems with different extent of tracking, $\theta^*$. Inset: Feature angle, $\theta$, vs. $\phi$. Non-optimized tracking (closed symbols) close to the geometric maximum ($\theta_{MAX}$, point 1) results in a sharp decrease in sample width that decreases optical coupling efficiency. Instead, coupling efficiency is optimized (open symbols) by a tradeoff between sample narrowing and self-shadowing (c.f. Eq. 4 in text) corresponding instead to an optimal angle (point 2). Simulated system response is shown for $R_1=R_2=5$, and is compared to a conventional non-tracking panel.
FIG. 3B is a graph showing coupling efficiency, $\eta_C$, integrated over a range of tracking angle (from $\phi=0$ to $\phi=\theta^*$) and normalized to conventional planar cell performance. For a given kirigami structure, optimal performance is obtained by tracking the source at normal incidence to $\theta^*$ corresponding to the maximum of each curve. For comparison, tracking to $\theta_{MAX}$ vs. tracking to the optimal $\theta^*$ is shown as solid and open symbols, respectively.

To maximize $\eta_C$, shadowing in the direction of stretching (the "axial" direction) is balanced against the decrease along the sample transverse axis. Tracking to $\theta_{MAX}$ may not be optimal due to the sharp decrease in projected area beyond some critical strain (see FIG. 2C). This geometric subtlety is quantified in FIG. 3A, where the differences in performance for optimized tracking (open symbols) were analyzed, and one variation of non-optimized tracking to $\theta_{MAX}$ defined by Eq. 3 (closed symbols).

As shown in the inset (θ vs. φ), each structure tracks the source as characterized by a unity slope, until a predetermined value of θ* is reached (i.e. extent of tracking), after which the angle of the structure is held constant. Here, θ* is denoted as point 1 and point 2 for the non-optimized and optimized procedures, respectively. The effects of these tracking modes are shown in the plot of $\eta_C$ vs. φ, as defined by Eq. 4. Note the difference in $\eta_C$ at large values of φ. Whereas tracking to $\theta_{MAX}$ (closed symbols) causes a large decrease in sample width and $\eta_C$ near the geometric limits of the structure, optimized tracking (open symbols) minimizes the tradeoff between sample narrowing and self-shadowing.

FIG. 3B shows the extension of this analysis to other cut geometries, where $\eta_C$ is integrated over a range of tracking angles (from φ=0 to φ=θ*) and normalized to conventional planar cell performance for identical operating conditions. FIG. 3B provides the appropriate tracking procedure for a given kirigami structure, where optimal performance is obtained by tracking the source at normal incidence until reaching θ*, corresponding to the maximum of each curve. For comparison, tracking to $\theta_{MAX}$ vs. the optimized intermediate angle are shown as solid and open symbols, respectively.

To demonstrate the integration of photovoltaic cells with the proposed kirigami tracking structure, potentially low cost, ultra-thin (~3 μm), flexible, crystalline gallium-arsenide (GaAs) cells fabricated by a combination of non-destructive epitaxial lift-off and cold welding was mounted to the Kapton® carrier substrate using direct-attachment bonding processes mentioned below.

In one embodiment, the photovoltaic cell comprises an active photovoltaic region comprising a flexible crystalline semiconducting cell. Non-limiting examples of the semiconducting cell includes InGaP, GaAs, InGaAs, InP, or InAlP. The flexible crystalline semiconducting cell typically has a thickness ranging from 2 to 10 μm, such as from 2 to 9 μm, from 2 to 8 μm, from 2 to 6 μm, from 3 to 8 μm, from 3 to 6 μm, from 4 to 8 μm, and from 4 to 6 μm.

For example, certain direct-attachment bonding processes have involved adding metal layers to adjoining surfaces of the active region and the flexible host substrate and using cold-welding to bond them. Cold-weld bonding processes typically include pressing two surfaces together at room temperature to achieve a uniformly bonded interface.

Alternative direct-attachment bonding processes may include thermocompression bonding, which typically involves the application of a lower pressure but at a high temperature (i.e., higher than the metal re-crystallization temperature). This process is typically not used when the flexible substrate has a glass transition and/or a melting temperature below the re-crystallization temperature of metal layers used in direct-attachment bonding processes.

Another direct-attachment technique for bonding metal layers associated with an ELO process that may be used is a thermally-assisted cold-weld bonding process using a lower pressure than typical cold-welding processes and a lower temperature than typical thermocompression bonding processes. Particularly, thermally-assisted cold-welding may reduce the likelihood of damaging semiconductor wafers, thereby increasing the reuse rate of the wafers for growing additional active regions.

Notably, the GaAs was patterned to coincide with predetermined values of $R_1$ and $R_2$ such that the active material would not be damaged during the cutting process, and also to minimize deformation within the active material during tracking. A top contact break pattern was used, allowing for electrical isolation of the cells; for practical systems, series/parallel connections are employed to maximize GaAs areal coverage.

Figure 4:
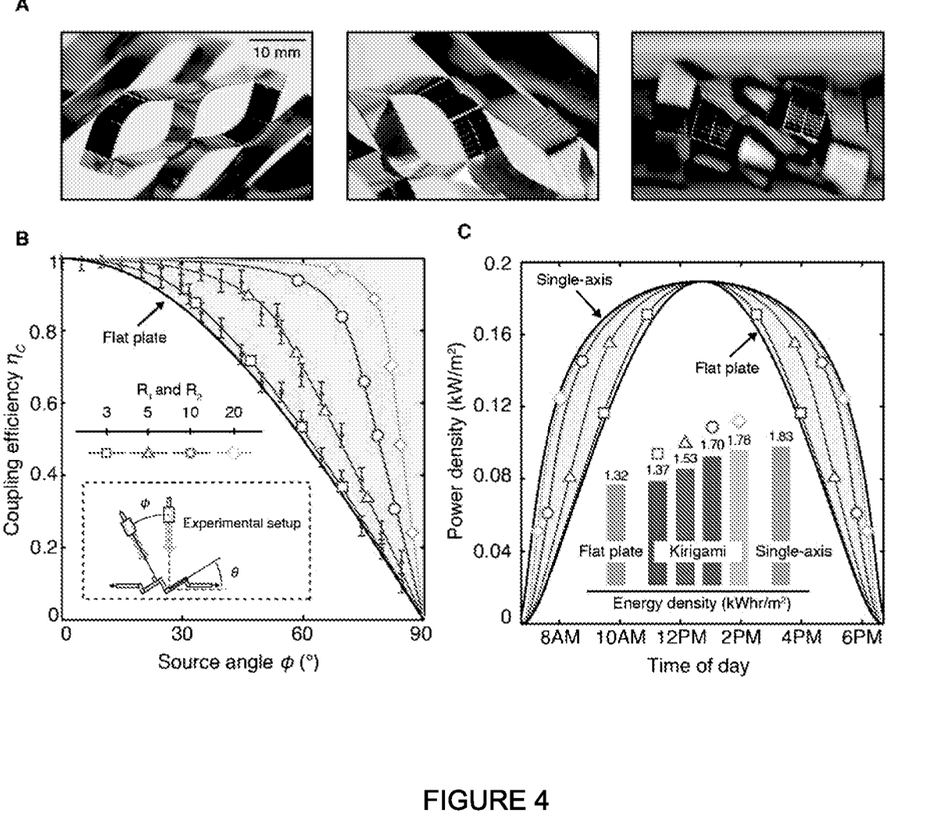
FIG. 4A is a photograph showing an integrated thin-film, crystalline GaAs solar cells, mounted by cold weld bonding on a Kapton® carrier substrate, according to an inventive embodiment.
FIG. 4B is a graph showing normalized solar cell short circuit current density $J_{SC}(\phi)/J_{SC}(\phi=0)$ for two samples, where $R_1=R_2=3$ and $R_1=R_2=5$ (closed symbols). Also shown are the simulated data for coupling efficiency, $\eta_C$, obtained from Eq. 4 (solid lines, open symbols). The agreement between experimental and simulated results suggests that $\eta_C$ is a direct measure of optical coupling, and that performance may be optimized by increasing $R_1$ and $R_2$.
FIG. 4C is a graph showing output electrical power density incident on the solar cell vs. time of day for several kirigami cut structures, stationary panel, and single-axis tracking systems at the equator and during Equinox. Inset: Integration of the curves yields the associated energy densities, where kirigami-enabled tracking systems are capable of near single-axis performance.

An example of a completed kirigami-enabled GaAs tracking device according to an inventive embodiment is shown in FIG. 4A. In this embodiment, an integrated thin-film, crystalline GaAs solar cells, mounted by cold weld bonding on a Kapton® carrier substrate, where $L_C$=15 mm, $L_U$=5 mm, and $W_C$=5 mm ($R_1=R_2=3$). By eliminating the top contact breakout pattern required for testing, and instead connecting each cell in series, the GaAs areal coverage can be maximized (>99%). Each sample was systematically stretched to track a moving AM 1.5G simulated solar spectrum collimated light source, and the current density vs. voltage (J-V) characteristics were obtained as a function of illumination angle. A schematic of the experiment is shown in the inset of FIG. 4B, where the sample was strained to track the light source to the optimal θ* shown in FIG. 3.

FIG. 4B plots the ratio of the normalized angle-dependent short circuit current density ($J_{SC}(\phi)/J_{SC}(\phi=0)$) for two samples, where $R_1=R_2=3$ and $R_1=R_2=5$ (closed symbols). Also shown is $\eta_C$ defined by Eq. 4 for several cut geometries (open symbols, solid lines). As expected, larger $R_1$ and $R_2$ lead to an increased coupling efficiency due to the suppression of $\varepsilon_T$ at equivalent $\varepsilon_A$. Furthermore, $J_{SC}(\phi)/J_{SC}(\phi=0)$ match $\eta_C$ predicted by Eq. 4, suggesting that $\eta_C$ is a direct measure of optical coupling in the presence of a suitable cell anti-reflective coating.

Figure 5:
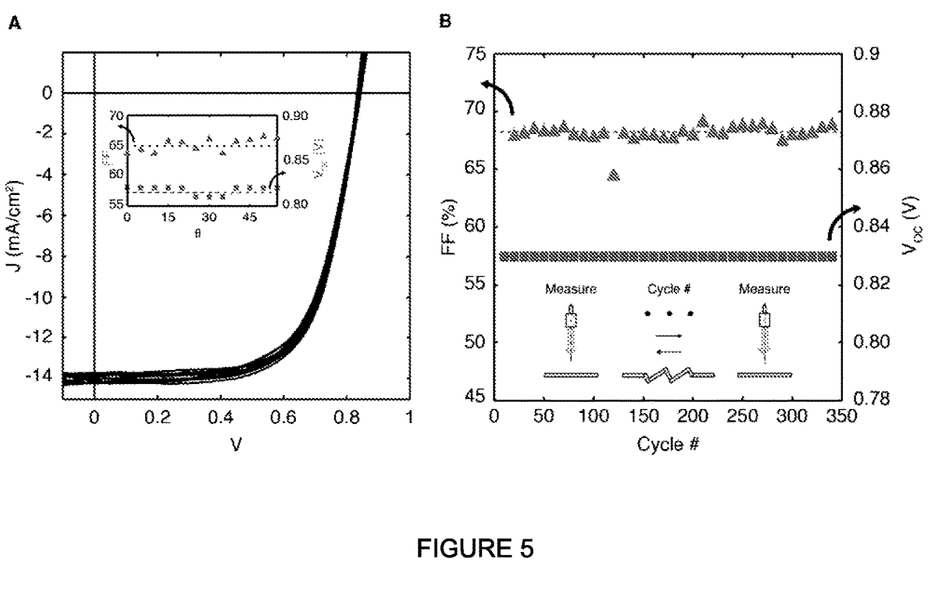
FIG. 5A is a graph showing properties associated with the inventive embodiment shown in FIG. 6. In particular, this graph shows J-V characteristics for a Kapton®-GaAs system where $R_1=R_2=5$ at incremental angles of simulated AM1.5G incidence at 1 sun (100 mW/cm$^2$) intensity, oriented normal to the surface of the solar cells (i.e. $\phi=\theta$). Inset: Fill factor, FF, and open circuit voltage, $V_{OC}$, show no appreciable degradation up until the optimal $\theta^*$, and the variation as shown (±1.1 and ±4.5 mV for FF and $V_{OC}$, respectively) is attributed to the error in control over feature angle (±1.0°, as noted earlier in the text). The power conversion efficiency of these devices under 1 sun AM1.5G illumination was 7.4±0.1% at the outset, with virtually no degradation upon cycling.
FIG. 5B is a graph showing properties associated with the inventive embodiment shown in FIG. 6. In particular, this graph shows FF and $V_{OC}$ vs. cycle number for the Kapton®-GaAs ELO solar cell, where $R_1=R_2=5$. There was no systematic change in FF or $V_{OC}$, with the random variation in measurements due to error in control over feature angle.

The electrical and mechanical responses to strain and cycling were also considered with implications for long-term solar tracking. For the Kapton®-GaAs system where $R_1=R_2=5$, there was no systematic change in either fill factor or open circuit voltage from θ=0 to θ* (FIG. 5A), with repeated measurements over 350 cycles yielding similar results shown in FIG. 5B. The strain energy from θ=0° to θ=θ* was measured to be 2.63±0.01 mJ/mm² for the first cycle. Subsequent cycling yielded an initial rapid decay in strain energy, reaching a saturation value of 1.67±0.02 mJ/mm² between 100 and 1000 cycles, without failure. The magnitude of strain energy, as well cycling losses due to plastic deformation, may be decreased by increasing $R_1$ and $R_2$ such that tracking occurs farther from the geometric limits of the structure (whose limits are shown as open symbols in FIG. 2B). For example, the strain energies of 50 μm-thick Kapton®-only samples were measured to be 7.60±0.46 mJ/mm², 5.30±0.60 mJ/mm², 3.03±1.06 mJ/mm², and 1.71±0.07 mJ/mm² for $R_1=R_2=3$, 5, 10, and 20, respectively.

Other types of substrates can be used as well, including thin spring steel. While the strain energy can increase relative to Kapton-based sheets, the net energy penalty per unit area remains orders of magnitude lower than the energy gain achieved by active solar tracking using this concept.

Figure 6:
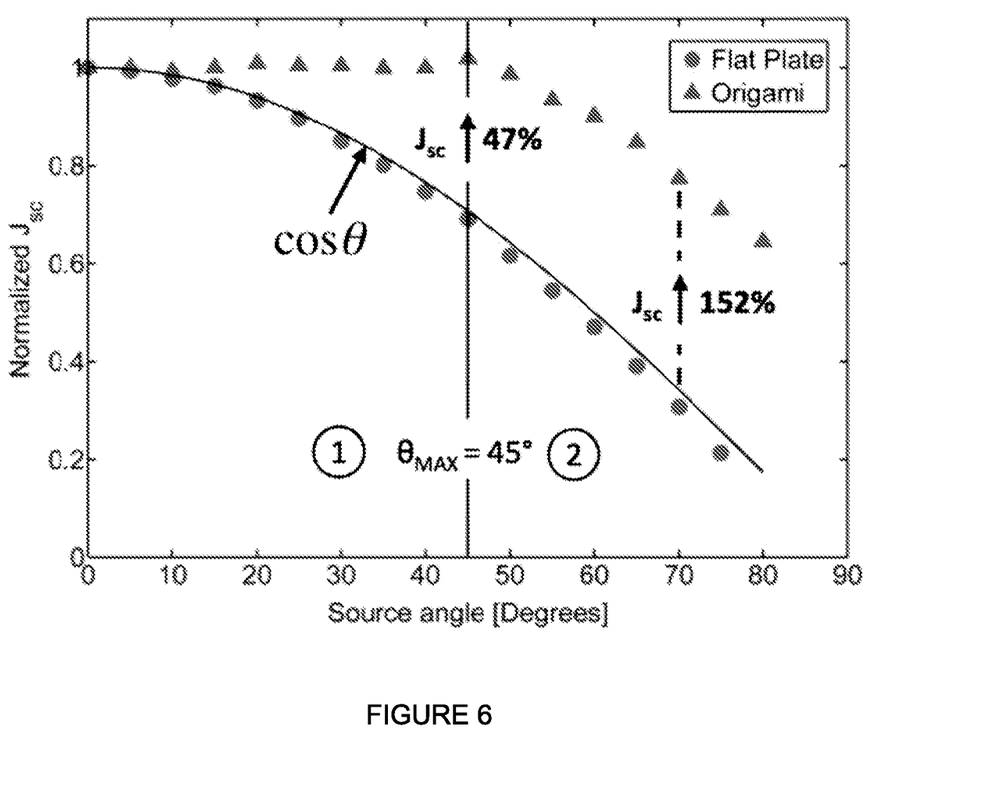
FIG. 6 is a graph showing comparative short circuit current properties of an embodiment made according to the present invention, such as shown in FIG. 4A, and a traditional flat plate cell.

The short circuit current of the inventive Kapton®-GaAs system shown in FIG. 4A, was also considered and compared to a traditional flat plate cell. In particular, FIG. 6 shows properties when the inventive embodiment was simulated at AM 1.5 illumination over varying source angles and compared to an identical solar cell in a flat plate configuration. In the case of the dynamic origami sample, the origami features were oriented with the angle of the light source such that the light source rays remained normal to the surface of the solar cell.

Figure 7:
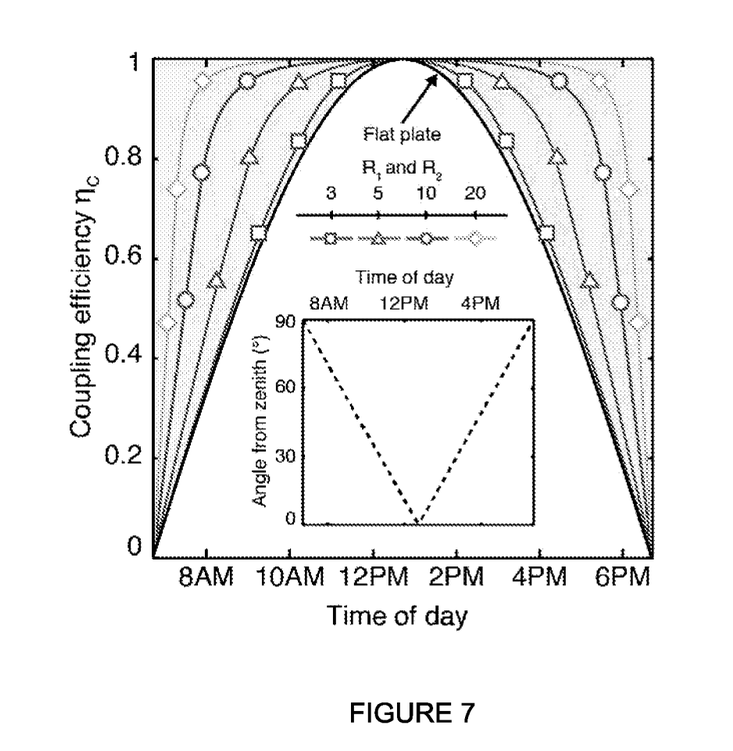
FIG. 7 is a graph showing coupling efficiency, $\eta_C$, vs. time of day for several kirigami structures. The relationship between the angle from zenith (i.e. source angle, $\phi$ in FIG. 4B) and time of day is shown in the inset, where the geographic location and time of year were chosen to be at the equator and during Equinox, respectively.

In the case of the flat plate experiment, only the light source angle was altered, to show cosine losses typically associated with misalignment. Before the maximum tracking angle of 45 degrees (as determined by the chosen cut geometry), there is zero decrease in short circuit current and a 47% increase compared to a traditional flat plate cell. After the maximum source angle, some shadowing is introduced as well as slight misalignment, resulting in a slightly decreased short circuit current. However, at a source angle of 70 degrees, the short circuit current is still 152% that of a conventional flat plate cell To compare kirigami-based tracking to non-tracking planar cells and conventional single-axis tracking systems, the trajectory of the sun across the azimuth should be considered. Thus, the solar angle, φ, depends on time of day, latitude, and day of the year (FIG. 7). FIG. 4E compares the output power per solar cell area vs. time of day at the equator and during Equinox for several kirigami tracking structures, as well as for stationary panels and single-axis trackers of equal area. In all cases, the power conversion efficiencies, PCE, of the solar cells are assumed to be 20%. As $R_1$ and $R_2$ are increased, the system becomes more efficient in the morning and evening at angles far from the zenith, and the output power density increases accordingly. As shown in the inset, the output energy density for an optimized kirigami system approaches that of conventional single-axis tracking in the limit of large values of $R_1$ and $R_2$.

In an embodiment, there is disclosed a method of making a photovoltaic system as described herein. The method comprises forming a pattern of cuts or openings on a flexible support structure, such as a plastic material, like a polyimide, or metal foil, wherein the support structure has a thickness ranging from 25 to 100 μm, such as from 25 to 80 μm, from 25 to 70 μm, from 25 to 60 μm, from 30 to 80 μm, from 30 to 70 μm, from 30 to 60 μm, from 40 to 80 μm, from 40 to 70 μm, and from 40 to 60 μm.

The pattern of cuts or openings formed on the flexible support structure define a unit cell structure having a cut length ($L_C$), an uncut length ($L_U$), and a spacing between cuts ($W_C$), which can be expressed in terms of the dimensionless parameters $R_1$ and $R_2$ where $R_1=L_C/L_U$ and $R_2=L_C/W_C$.

The method further comprises coating one surface of a plastic support structure with at least one metal chosen from Au, Ag, Pt, Pd, Ni, and Cu, with a particular emphasis on Au. In one embodiment, the method of coating an Au layer on the support substrate comprises depositing Au to a thickness ranging from 100-500 μm, such as from 200-400 μm.

When the flexible material comprises a plastic material, it typically has a conductive metal coating on one surface. Non-limiting examples of the metal coating includes at least one metal chosen from Au, Ag, Pt, Pd, Ni, and Cu, with a particular emphasis on Au. In one embodiment, the Au layer on the support substrate has a thickness ranging from 100 to 500 μm, such as from 100 to 400 μm, from 100 to 300 μm, from 200 to 500 μm, 200 to 400 μm, from 200 to 300 μm, and from 300 to 500 μm.

The method then comprises forming a photovoltaic cell comprising a flexible crystalline semiconducting material. Non-limiting examples of the crystalline semiconducting material that can be grown includes InGaP, GaAs, InGaAs, InP, or InAlP.

After the photovoltaic cell is formed, it too is coated with a conductive metal coating on one surface. Non-limiting examples of the metal coating includes at least one metal chosen from Au, Ag, Pt, Pd, Ni, and Cu, with a particular emphasis on Au. In one embodiment, the Au layer on the support substrate has a thickness ranging from 100 to 500 µm, such as from 100 to 400 µm, from 100 to 300 µm, from 200 to 500 µm, 200 to 400 µm, from 200 to 300 µm, and from 300 to 500 µm.

Next, the photovoltaic cell is removed from the growth substrate by a non-destruction ELO process, and mounted on the support structure by a direct-attachment bonding process. U.S. Pat. No. 8,378,385 and U.S. Patent Application Publication No. US 2013/0043214 are incorporated herein by reference for their disclosure of processes, growth structures and protection layer schemes for protecting wafers and device regions during ELO.

Non-limiting examples of the direct-attachment bonding processes includes cold-welding, thermally assisted cold-welding, or thermo-compression bonding. U.S. Patent Application Publication No. US 2013/0037095, which describes cold-welding, is incorporated herein by reference.

The method described herein may further comprises coupling an actuator to the support structure to allow the support structure and the photovoltaic cell to change their shapes in response to a force applied by the actuator. For example, in a relaxed or unstretched state, the support structure comprises a two-dimensional material. However, once stretched such as by a force from an actuator, the support structure expands to a three-dimensional material, such that the stretched support structure resembles an expanded mesh created by linear and offset cuts in structure.

The system, devices and methods described herein will be further described by the following non-limiting examples, which are intended to be purely exemplary.

EXAMPLES

Experimental Measurement of Axial and Transverse Strain

Samples of 50 µm-thick E-type Kapton® were cut into the kirigami structures in FIG. 2B using a 50 W Universal Laser Systems $CO_2$ laser (2% power, 2.5% speed, 500 PPI). For $R_1=R_2=3$, $L_C=6$ mm, $L_U=6$ mm, and $W_C=6$ mm. For $R_1=R_2=5$, $L_C=10$ mm, $L_U=2$ mm, and $W_C=2$ mm. For $R_1=R_2=10$, $L_C=20$ mm, $L_U=2$ mm, and $W_C=2$ mm. For $R_1=R_2=20$, $L_C=20$ mm, $L_U=1$ mm, and $W_C=1$ mm. The measured curl of the cut was 150 µm. The samples were the placed on an apparatus that systematically strained the system to the maximum feature angle, $\theta_{MAX}$ (see Eq. 3). The straining process was imaged in situ using two cameras: one facing directly downwards to capture transverse strain, $\varepsilon_T$, and a second facing the edge of the sample to capture the change in feature angle, $\theta$. Both cameras captured the axial strain, $\varepsilon_A$. The resulting images were analyzed using ImageJ (Rasband, W. S., U.S. National Institutes of Health, Bethesda, Md., USA), where a global calibration scale was used to define measurement lengths. Strain limitations imposed by the range of motion of the apparatus prohibited data collection at high strain values, as shown in FIG. 2B.

Epitaxial Lift-Off (ELO) Gallium-Arsenide Solar Cell Fabrication

Epitaxial layers of p-n junction GaAs active material on an AlAs sacrificial layer were grown by gas-source molecular beam epitaxy (GSMBE) on a 2 inch-diameter (100) GaAs substrate. For the ELO process, 0.2 µm thick GaAs buffer layer followed by a 20 nm thick AlAs sacrificial layer were grown, first. Then, following inverted photovoltaic device layers were grown: 0.1 µm thick, $5 \times 10^{18}$ $cm^{-3}$ Be-doped GaAs p-contact layer, 0.025 µm thick, $2 \times 10^{18}$ $cm^{-3}$ Be-doped $Al_{0.20}In_{0.49}Ga_{0.31}P$ window layer, 0.15 µm thick, $1 \times 10^{18}$ $cm^{-3}$ Be-doped p-GaAs emitter layer, 3.0 µm thick, $2 \times 10^{17}$ $cm^{-3}$ Si-doped n-GaAs base layer, 0.05 µm thick, $6 \times 10^{17}$ $cm^{-3}$ Si-doped $In_{0.49}Ga_{0.51}P$ back surface field (BSF) layer, and 0.05 µm thick, $5 \times 10^{18}$ $cm^{-3}$ Si-doped n-GaAs contact layer. The sample was then coated with a 300 nm thick Au layer by e-beam evaporation, and bonded to a 50 µm-thick E-type Kapton® sheet (also coated in 300 nm Au layer) using cold weld bonding by applying a pressure of 4 MPa for 8 minutes at a temperature of 230° C. at $10^{-5}$ torr. After bonding, the photovoltaic epitaxial active region and Kapton® carrier were isolated from the bulk wafer using epitaxial lift-off (ELO) by selectively removing the AlAs sacrificial layer in dilute (15%) hydrofluoric acid (HF) solution at room temperature.

After ELO, a Pd (5 nm)/Zn (20 nm)/Au (700 nm) front metal contact was patterned using photolithography. Then, the device mesas were similarly defined using photolithography and subsequent chemical etching using $H_3PO_4:H_2O_2$: deionized $H_2O$ (3:1:25). The exposed, highly Be-doped 150 nm thick p+ GaAs contact layer was selectively removed using plasma etching. After annealing the sample for 1 hr at 200° C. to facilitate ohmic contact formation, the sidewalls were passivated with 1 µm-thick polyimide applied by spin coating. After curing the sample at 300° C. for 30 min, the polyimide was selectively removed by photolithography and plasma etching. The external contact pad was patterned with Ti (10 nm)/Au (500 nm). Finally, a bilayer anti-reflection coating consisting of $TiO_2$ (49 nm) and $MgF_2$ (81 nm) was deposited by e-beam evaporation.

Experimental Measurement of Coupling Efficiency using Kirigami-Enabled GaAs Cells The ELO GaAs solar cells were cut to match the kirigami pattern using an X-Acto knife. For $R_1=R_2=3$, $L_C=15$ mm, $L_U=5$ mm, and $W_C=5$ mm. For $R_1=R_2=5$, $L_C=15$ mm, $L_U=3$ mm, and $W_C=3$ mm. The cells were systematically strained using a micro-strain apparatus to track a moving AM1.5 G light source (Oriel solar simulator, model 91191 with Xenon arc lamp and AM 1.5 global filter, simulated 1 sun, 100 mW/$cm^2$ intensity), following the optimal tracking method described in FIG. 3. The J-V characteristics were measured at each angle using a semiconductor parameter analyzer (SPA, Agilent 4155B), in increments of five degrees, from normal incidence ($\phi=0°$) to $\phi=90°$. The short circuit current density, $J_{SC}$, was determined at each angle, and subsequently normalized to $J_{SC}$ at $\phi=0°$. The normalized $J_{SC}$ are plotted in FIG. 4B, along with values of coupling efficiency, $\eta_C$, predicted by Eq. 4.

Effect of Deformation and Cycling on Cell Performance

An ELO GaAs solar cell with $L_C=15$ mm, $L_U=3$ mm, and $W_C=3$ mm ($R_1=R_2=5$) to determine the effects of mechanical deformation. For this experiment, GaAs was patterned only in the center of the cut length, such that there were no cosine losses due to $\varepsilon_T$ during operation. The cell was systematically strained using a device to track a moving AM1.5 G light source as described above. The J-V characteristics, open circuit voltage, $V_{OC}$, and fill factor, FF were measured at each angle as shown in FIG. 4C. After recording the response from $\phi=0°$ to $\phi=\theta^*$, the cell was relaxed (i.e. $\varepsilon_T=0$) and the source returned to $\phi=0°$. The cell was repeatedly strained to $\theta=\theta^*$, while the source was kept constant at $\phi=0°$. Cell performance was measured every 10 cycles, when $\phi=0$ (and consequently $\phi=0°$), for 350 cycles (to simulate approximately one year of operation), with results shown in FIG. 4D.

Effect of Deformation and Cycling on Strain Energy

The stress-strain characteristics of the ELO GaAs cell with dimensions of $L_C$=15 mm, $L_U$=3 mm, and $W_C$=3 mmd ($R_1$=$R_2$=5) were measured using a TA.XTPlus Texture Analyzer (Texture Technologies, Hamilton, Mass., USA). Sample length, as measured from the first cut to the last cut in the axial direction, was 33 mm. To model the tracking process in FIG. 3, the Exponent (Texture Technologies, Hamilton, Mass., USA) software package was used to stretch the sample to a displacement of 25 mm to approximate the optimal extent of tracking ($\varepsilon_T$=0.79, $\theta^* \approx 56°$. This process was repeated 1000 times, and the resulting curves were integrated to find the strain energy.

To quantify strain energy of Kapton®-only samples, 50 µm-thick Kapton® samples were cut using a 50 W Universal Laser Systems $CO_2$ laser (2% power, 2.5% speed, 500 PPI). For $R_1$=$R_2$=3, $L_C$=6 mm, $L_U$=6 mm, and $W_C$=6 mm. For $R_1$=$R_2$=5, $L_C$=10 mm, $L_U$=2 mm, and $W_C$=2 mm. For $R_1$=$R_2$=10, $L_C$=20 mm, $L_U$=2 mm, and $W_C$=2 mm. For $R_1$=$R_2$=20, $L_C$=20 mm, $L_U$=1 mm, and $W_C$=1 mm. In each case, the sample length as measured from the first cut to the last cut in the axial direction was 36 mm. For each sample, the TA.XTPlus Texture Analyzer and Exponent were used to strain each sample to the strain corresponding to the optimal extent of tracking. For $R_1$=$R_2$=3, $\varepsilon_T$=0.25 and $\theta^* \approx 37°$. For $R_1$=$R_2$=5, $\varepsilon_T$=0.69 and $\theta^* \approx 54°$. For $R_1$=$R_2$=10, $\varepsilon_T$=2.42 and $\theta^* \approx 73°$. For $R_1$=$R_2$=3, $\varepsilon_T$=6.18 and $\theta^* \approx 82°$.

To compare values of strain energy for the Kapton®-GaAs sample for $R_1$=$R_2$=5 and the Kapton®-only sample for $R_1$=$R_2$=5, the differences in cut parameters, namely $L_C$, $L_U$, and $W_C$ are required for analysis. Whereas tracking efficiency (i.e. $\eta_C$) is only dependent on $R_1$ and $R_2$ (regardless of the combination of $L_C$, $L_U$, and $W_C$ used to obtain $R_1$ and $R_2$), the mechanical response of the structure is a function of the extent of overlap between cuts as well as cut density. Hence, identical values of $L_C$, $L_U$, and $W_C$ (and the corresponding values of $R_1$ and $R_2$) are required for a direct comparison. The values of strain energy for the Kapton®-only samples are provided only to show the effect of structure optimization (i.e. increasing $R_1$ and $R_2$) on strain energy, and should not be compared to the reported value of strain energy for the Kapton®-GaAs sample.

The description of the embodiments herein has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A photovoltaic system, comprising:
a solar tracking structure comprising:
 a support structure comprising a flexible material having a unit cell structure defined by a pattern of openings in the support structure, wherein said pattern of openings comprises a cut length ($L_c$), an uncut length ($L_u$), and a spacing between cuts ($W_c$), which can be expressed in terms of the dimensionless parameters $R_1$ and $R_2$ where $R_1 = L_c/L_u$ and $R_2 = L_c/W_c$ wherein the support structure tracks a light source by tilting when stretched; and
 a flexible photovoltaic cell disposed on the support structure.

2. The photovoltaic system of claim 1, wherein the flexible material comprises a plastic material or metal foil.

3. The photovoltaic system of claim 2, wherein the flexible material comprises a plastic material having a conductive metal coating on one surface.

4. The photovoltaic system of claim 3, wherein the plastic material comprises a polyimide.

5. The photovoltaic system of claim 3, wherein the metal coating comprises at least one metal chosen from Au, Ag, Pt, Pd, Ni, and Cu.

6. The photovoltaic system of claim 1, wherein the photovoltaic cell comprises an active photovoltaic region comprising a flexible crystalline semiconducting cell.

7. The photovoltaic system of claim 6, wherein the flexible, crystalline semiconducting cell comprises InGaP, GaAs, InGaAs, InP, or InAlP.

8. The photovoltaic system of claim 1, wherein the photovoltaic cell is mounted to the support structure by a direct-attachment bonding process chosen from cold-welding, thermally assisted cold-welding, or thermo-compression bonding.

9. The photovoltaic system of claim 1, further comprising an actuator operably coupled to the support structure, wherein the support structure and the photovoltaic cell change their shapes in response to a force applied by the actuator.

10. The photovoltaic system of claim 1, wherein $R_1$=$R_2$.

11. The photovoltaic system of claim 1, wherein the support structure has a thickness ranging from 25 to 100 µm; and the flexible photovoltaic cell has a thickness ranging from 2 to 10 µm.

12. The photovoltaic system of claim 1, further comprising an optical collector or concentrator.

13. The photovoltaic system of claim 1, wherein the support structure is a three-dimensional expanded mesh structure when stretched from a linear two-dimensional structure.

14. The photovoltaic system of claim 13, wherein the expanded mesh is created by the pattern of openings in the structure.

* * * * *

UNITED STATES PATENT AND TRADEMARK OFFICE
CERTIFICATE OF CORRECTION

PATENT NO. : 10,637,391 B2
APPLICATION NO. : 15/034299
DATED : April 28, 2020
INVENTOR(S) : Forrest et al.

Page 1 of 1

It is certified that error appears in the above-identified patent and that said Letters Patent is hereby corrected as shown below:

Claim 7, Column 14, Line 30, "InAIP" should read --InAlP--.

Signed and Sealed this
Thirtieth Day of June, 2020

Andrei Iancu
*Director of the United States Patent and Trademark Office*